US 11,374,539 B2

(12) United States Patent
Kato

(10) Patent No.: US 11,374,539 B2
(45) Date of Patent: Jun. 28, 2022

(54) DOHERTY AMPLIFIER

(71) Applicant: Mitsubishi Electric Corporation, Tokyo (JP)

(72) Inventor: Katsuya Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 16/980,740

(22) PCT Filed: Aug. 20, 2018

(86) PCT No.: PCT/JP2018/030654
§ 371 (c)(1),
(2) Date: Sep. 14, 2020

(87) PCT Pub. No.: WO2020/039474
PCT Pub. Date: Feb. 27, 2020

(65) Prior Publication Data
US 2021/0013840 A1  Jan. 14, 2021

(51) Int. Cl.
*H03F 1/02* (2006.01)
*H03F 1/56* (2006.01)
*H03F 3/21* (2006.01)

(52) U.S. Cl.
CPC .......... *H03F 1/0288* (2013.01); *H03F 1/56* (2013.01); *H03F 3/211* (2013.01);
(Continued)

(58) Field of Classification Search
CPC .......... H03F 1/0288; H03F 1/56; H03F 3/211; H03F 2200/222; H03F 2200/372; H03F 2200/387

(Continued)

(56) References Cited

U.S. PATENT DOCUMENTS

2004/0113697 A1   6/2004 Pengelly et al.
2005/0231286 A1   10/2005 Gotou et al.
(Continued)

FOREIGN PATENT DOCUMENTS

CN        104113286 B     8/2017
JP        2005-303771 A   10/2005
(Continued)

OTHER PUBLICATIONS

An Office Action mailed by the Japan Patent Office dated Jun. 29, 2021, which corresponds to Japanese Patent Application No. 2020-537907 and is related to U.S. Appl. No. 16/980,740; with English translation.

(Continued)

*Primary Examiner* — Hafizur Rahman
(74) *Attorney, Agent, or Firm* — Studebaker & Brackett PC

(57) ABSTRACT

A package (1) includes first and second input terminals (2,3) which are adjacent to each other, and first and second output terminals (4,5) which are adjacent to each other. A first input matching circuit (6), a first delay circuit (7), a second input matching circuit (8), a first amplifier (9), and a first output matching circuit (10) are sequentially connected between the first input terminal (2) and the first output terminal (4) inside the package (1). A third input matching circuit (11), a second amplifier (12), a second output matching circuit (13), a second delay circuit (14), and a third output matching circuit (15) are sequentially connected between the second input terminal (3) and the second output terminal (5) inside the package (1). First to fourth matching circuits (16-19) are respectively connected to the first input terminal (2), the second input terminal (3), the first output terminal (4) and the second output terminal (5) outside the package (1).

5 Claims, 13 Drawing Sheets

(52) U.S. Cl.
CPC .. *H03F 2200/222* (2013.01); *H03F 2200/372* (2013.01); *H03F 2200/387* (2013.01)

(58) Field of Classification Search
USPC .......................................................... 330/295
See application file for complete search history.

(56) References Cited

U.S. PATENT DOCUMENTS

2015/0002229 A1  1/2015  Kuo et al.
2017/0359032 A1  12/2017  McLaren

FOREIGN PATENT DOCUMENTS

| | | |
|---|---|---|
| JP | 2006-510312 A | 3/2006 |
| JP | 2015-012609 A | 1/2015 |

OTHER PUBLICATIONS

International Search Report; Written Opinion; and Notification of Transmittal of The International Search Report and the Written Opinion of the International Searching Authority, or the Declaration issued in PCT/JP2018/030654; dated Nov. 13, 2018.
Office Action issued in TW 108107791; mailed by the Taiwan Intellectual Property Office dated May 20, 2019.

DOHERTY AMPLIFIER

FIELD

The present disclosure relates to a Doherty amplifier with two amplifiers in one package.

BACKGROUND

In mobile communication, a transmission power amplifier is typically required to have high efficiency and low distortion. Further, to support high-speed and large-capacity communication in recent years, a modulation wave signal with a high PAPR (Peak Average Power Ratio) is used. In a case where a signal with a high PAPR is amplified with a power amplifier, to satisfy standards of distortion, the power amplifier is made to operate at low average output power which is obtained by providing back off with saturation output power. Because a back off amount typically inversely relates to efficiency, in a case where a high PAPR is used, high efficiency cannot be expected. Amplifiers called Doherty amplifiers which can solve this problem are widely employed mainly at communication base stations.

In the Doherty amplifier, a main amplifier which is biased to class AB or class B, and a peak amplifier which is biased to class C are synthesized in parallel using a $\lambda/4$ line. The $\lambda/4$ line is positioned at output of one of the amplifiers. The $\lambda/4$ line is positioned also at input of the other amplifier. Because the two amplifiers operate in a similar manner and are synthesized in phase upon input of a large signal, characteristics which are similar to characteristics of a 2-synthesized amplifier are exhibited, and large saturation output power can be realized. Meanwhile, upon input of a small signal, because only the main amplifier operates, and the $\lambda/4$ line connected to the output side of the main amplifier functions as an impedance inverter, high efficiency can be obtained by high load impedance. Therefore, the Doherty amplifier can realize high efficiency in a wide output power range.

Because the Doherty amplifier uses two amplifiers, it is desirable to store the two amplifiers in one package to reduce a size. Meanwhile, if the whole of the Doherty amplifier is integrated, it is difficult to finely adjust characteristics. Therefore, it is desirable to store the two amplifiers and only part of matching circuits into a package, and provide an adjustable portion outside the package. However, electromagnetic coupling between adjacent input terminals or between adjacent output terminals affects device characteristics. It is considered that this is because, compared to a case where the Doherty amplifier is constituted with two sets of semiconductor devices each in which one amplifier is stored in one package, as well as a distance between terminals being reduced, a signal which passes between adjacent terminals has a phase difference of 90 degrees. While a method in which an electric shield is provided within a package is proposed to address this problem, reduction in a size is limited due to a size of the electric shield. Further, it is also proposed to package all components other than a division circuit and a synthetic circuit of the Doherty amplifier (see, for example, PTL 1).

Citation List

Patent Literature

[PTL 1] JP 2005-303771 A

SUMMARY

Technical Problem

While it is possible to suppress electromagnetic coupling by packaging all components other than a division circuit and a synthetic circuit, there is a problem that it is difficult to finely adjust characteristics as described above.

The present invention has been made to solve the problem as described above, and an object of the present invention is to obtain a Doherty amplifier which enables fine adjustment of characteristics to be easily performed while electromagnetic coupling is suppressed.

Solution to Problem

A Doherty amplifier according to the present disclosure includes: a package including first and second input terminals which are adjacent to each other, and first and second output terminals which are adjacent to each other; a first input matching circuit, a first delay circuit, a second input matching circuit, a first amplifier, and a first output matching circuit sequentially connected between the first input terminal and the first output terminal inside the package; a third input matching circuit, a second amplifier, a second output matching circuit, a second delay circuit, and a third output matching circuit sequentially connected between the second input terminal and the second output terminal inside the package; first to fourth matching circuits respectively connected to the first input terminal, the second input terminal, the first output terminal and the second output terminal outside the package; a division circuit provided outside the package, equally dividing an input signal into two signals and respectively inputting the two signals to the first and the second input terminals via the first and the second matching circuits; and a synthetic circuit provided outside the package and synthesizing signals input from the first and the second output terminals via the third and the fourth matching circuits into one signal.

Advantageous Effects of Invention

In the present disclosure, because the delay circuits are incorporated into the package, it is possible to make phases the same between the input terminals and between output terminals of the package. By this means, it is possible to suppress electromagnetic coupling occurring at a small package. Further, it is possible to easily finely adjust characteristics of the Doherty amplifier at the matching circuits outside the package.

DESCRIPTION OF EMBODIMENTS

A Doherty amplifier according to the embodiments of the present disclosure will be described with reference to the drawings. The same components will be denoted by the same symbols, and the repeated description thereof may be omitted.

Embodiment 1

Figure 1:
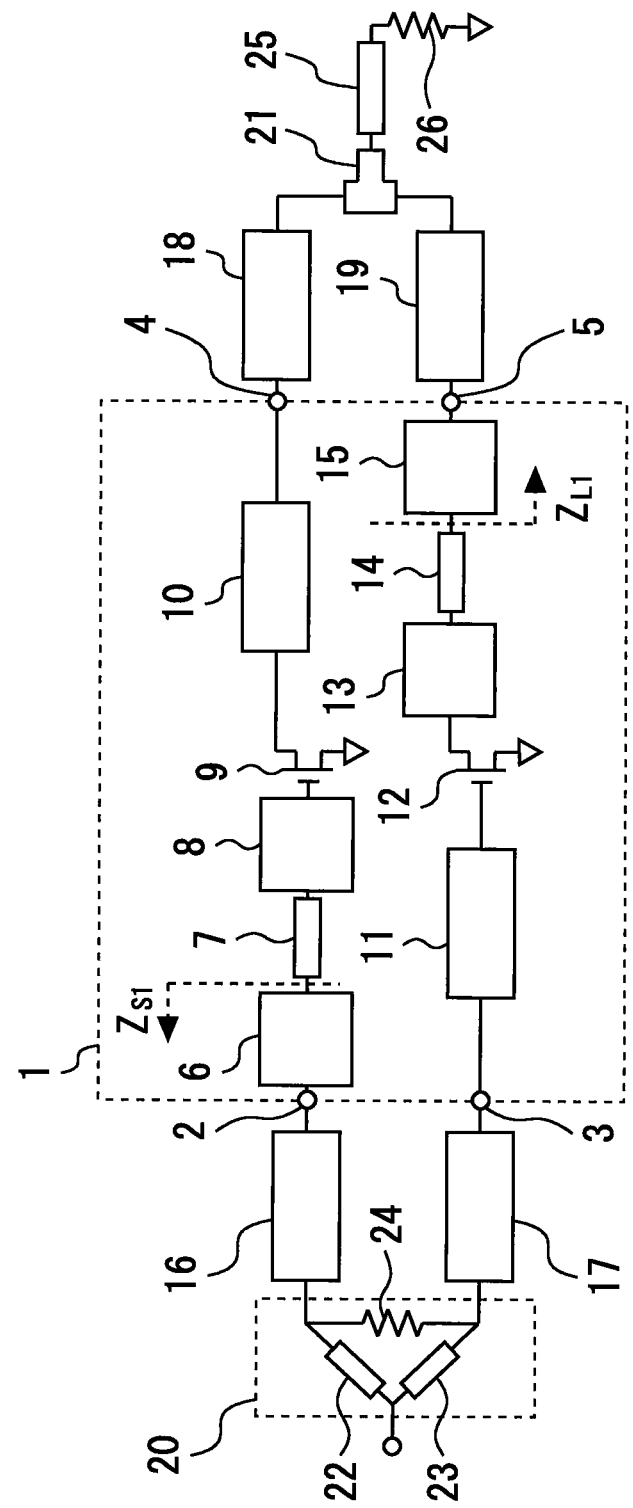
FIG. 1 is a view illustrating a Doherty amplifier according to Embodiment 1.

FIG. 1 is a view illustrating a Doherty amplifier according to Embodiment 1. A package 1 includes first and second input terminals 2 and 3 which are adjacent to each other, and first and second output terminals 4 and 5 which are adjacent to each other.

A first input matching circuit 6, a first delay circuit 7, a second input matching circuit 8, a first amplifier 9, and a first output matching circuit 10 are sequentially connected between the first input terminal 2 and the first output terminal 4 inside the package 1. A third input matching circuit 11, a second amplifier 12, a second output matching circuit 13, a second delay circuit 14, and a third output matching circuit 15 are sequentially connected between the second input terminal 3 and the second output terminal 5 inside the package 1.

The first amplifier 9 and the second amplifier 12 are, for example, GaN-HEMTs. The first amplifier 9 is biased to class AB or class B. The second amplifier 12 is biased to class C. The second input matching circuit 8, or the like, are connected to a gate of the first amplifier 9, and the first output matching circuit 10 is connected to a drain of the first amplifier 9. The third input matching circuit 11 is connected to a gate of the second amplifier 12, and the second output matching circuit 13, or the like, are connected to a drain of the second amplifier 12.

First to fourth matching circuits 16 to 19 are respectively connected to the first input terminal 2, the second input terminal 3, the first output terminal 4 and the second output terminal 5 outside the package 1. The first and the second matching circuits 16 and 17 may include gate bias circuits. The third and the fourth matching circuits 18 and 19 may include drain bias circuits.

A division circuit 20 and a synthetic circuit 21 are also provided outside the package 1. The division circuit 20 equally divides an input signal into two signals in phase and inputs the respective signals to the first and the second input terminals 2 and 3 via the first and the second matching circuits 16 and 17. The division circuit 20 is a Wilkinson division circuit having microstrip lines 22 and 23 whose characteristic impedance is 70.71Ω and which has an electrical length of ¼ of a wavelength λ of an input signal, and a resistor 24 of 100Ω.

The synthetic circuit 21 synthesizes signals input from the first and the second output terminals 4 and 5 via the third and the fourth matching circuits 18 and 19 into one signal. The matching circuit 25 and a load 26 are connected to output of the synthetic circuit 21. A resistance value of the load 26 is typically 50Ω. The matching circuit 25 is a microstrip line whose characteristic impedance is 35.36Ω and which has an electrical length of ¼ of a wavelength λ of an input signal.

Circuits inside the package 1 are constituted with, for example, a metal pattern formed on a resin substrate whose relative permittivity is from 3 to 4, and whose thickness is from approximately 20 to 30 mils, and SMD (Surface Mount Device) components. Matching circuits inside the package 1 are constituted with an inductance of a bonding wire, a MIM (Metal Insulator Metal) capacitor or a microstrip line formed on a dielectric substrate whose relative permittivity is from 30 to 300. The first and the second delay circuits 7 and 14 are microstrip lines formed on a dielectric substrate whose relative permittivity is from 30 to 300.

Figure 2:
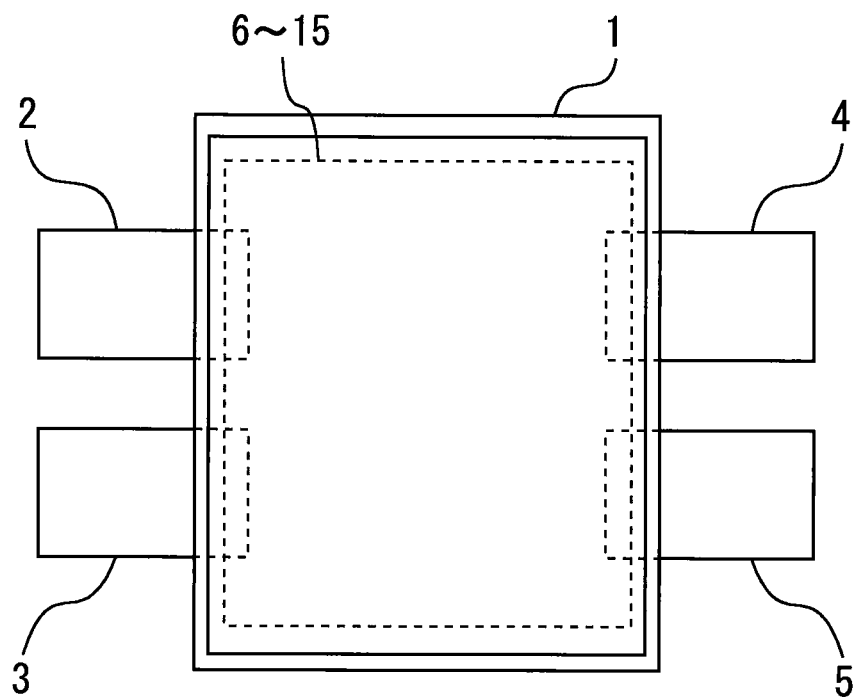
FIG. 2 is a plan view illustrating a package of a Doherty amplifier according to Embodiment 1.
Figure 3:
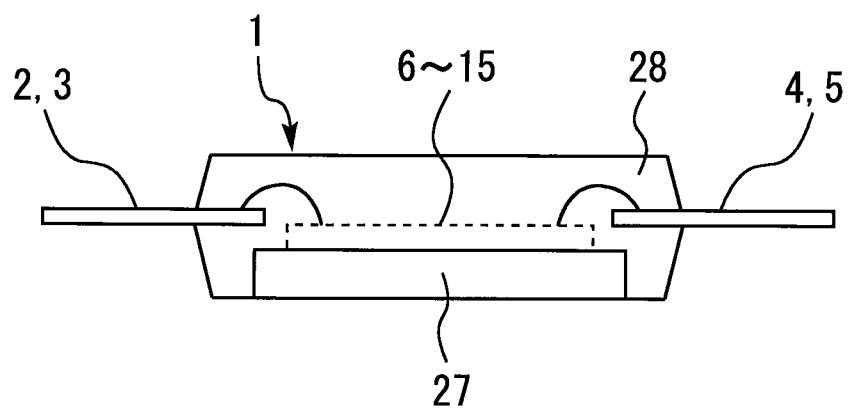
FIG. 3 is a cross-sectional diagram illustrating the package of the Doherty amplifier according to Embodiment 1.

FIG. 2 is a plan view illustrating a package of a Doherty amplifier according to Embodiment 1. FIG. 3 is a cross-sectional diagram illustrating the package of the Doherty amplifier according to Embodiment 1. The first amplifier 9, the second amplifier 12, or the like, are mounted on a heatsink 27. The first and the second input terminals 2 and 3, the first and the second output terminals 4 and 5, and the heatsink 27 are fixed with a molding material 28. However, the package 1 is not limited to a molded package and may be a ceramic package.

The first to the third input matching circuits 6, 8 and 11 and the first and the second matching circuits 16 and 17 are designed so that signals can be input to gates of the first amplifier 9 and the second amplifier 12 without being reflected upon input of a large signal. The first to the third output matching circuits 10, 13 and 15 and the third and the fourth matching circuits 18 and 19 are designed so that impedance of an output side seen from drains of the first amplifier 9 and the second amplifier 12 becomes optimum load impedance $Z_{opt}$. Typically, $Z_{opt}$ is determined through load-pull calculation or load-pull evaluation of a transistor, and is set at load at which saturation efficiency becomes a maximum, load at which power load efficiency becomes a maximum, load at which saturation output power becomes a maximum, or the like.

Impedance of an input side seen from an output end of the first input matching circuit 6 is first impedance $Z_{S1}$ at a frequency of an input signal. Impedance of an output side seen from an input end of the third output matching circuit 15 is second impedance $Z_{L1}$ at a frequency of an input signal. $Z_{S1}$ and $Z_{L1}$ do not have an imaginary part. The characteristic impedance of the first delay circuit 7 is the same as $Z_{S1}$. The characteristic impedance of the second delay circuit 14 is the same as $Z_{L1}$. Because the first delay circuit 7 and the second delay circuit 14 delay only a phase without changing impedance, the first delay circuit 7 and the second delay circuit 14 need to be connected to a circuit having impedance which does not have an imaginary part.

A matching circuit from the drain of the first amplifier 9 to the synthetic circuit 21 is designed so that a passband phase becomes 90 degrees+180×N degrees (where N is a natural number) at a frequency of an input signal. Further, a matching circuit from the drain of the second amplifier 12 to the synthetic circuit 21 is designed so that a passband phase becomes 0 degrees+180×M (M is a natural number) at a frequency of an input signal. Here, a case where N=0 and M=1 will be described. By the matching circuits being designed in this manner, impedance at a small signal on the second amplifier 12 side seen from the synthetic circuit 21 becomes open. Further, load impedance at a small signal of the first amplifier 9 is set at impedance twice as high as that upon a large signal.

Figure 4:
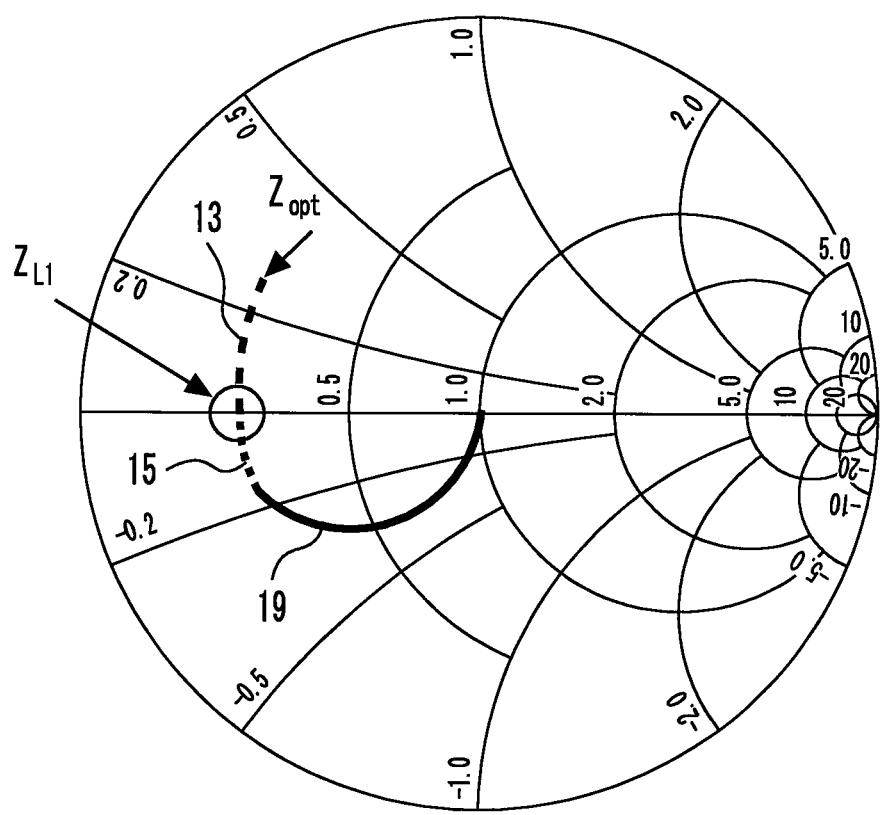
FIG. 4 is a view illustrating impedance transformation of an output matching circuit of the second amplifier according to Embodiment 1.

FIG. 4 is a view illustrating impedance transformation of an output matching circuit of the second amplifier according to Embodiment 1. Impedance is transformed from 50Ω to $Z_{L1}$ at the third output matching circuit 15 and the fourth matching circuit 19. The second delay circuit 14 is connected to a position at which impedance becomes this $Z_{L1}$ which does not have an imaginary part, and is constituted with a microstrip line which has an electrical length of ¼ of a wavelength λ of a signal at characteristic impedance $Z_{L1}$. The first delay circuit 7 is also connected to a position at which impedance becomes the impedance $Z_{S1}$ which does not have an imaginary part in a similar manner, and is constituted with a microstrip line which has an electrical length of ¼ of a wavelength λ of a signal at the characteristic impedance $Z_{S1}$.

Figure 5:
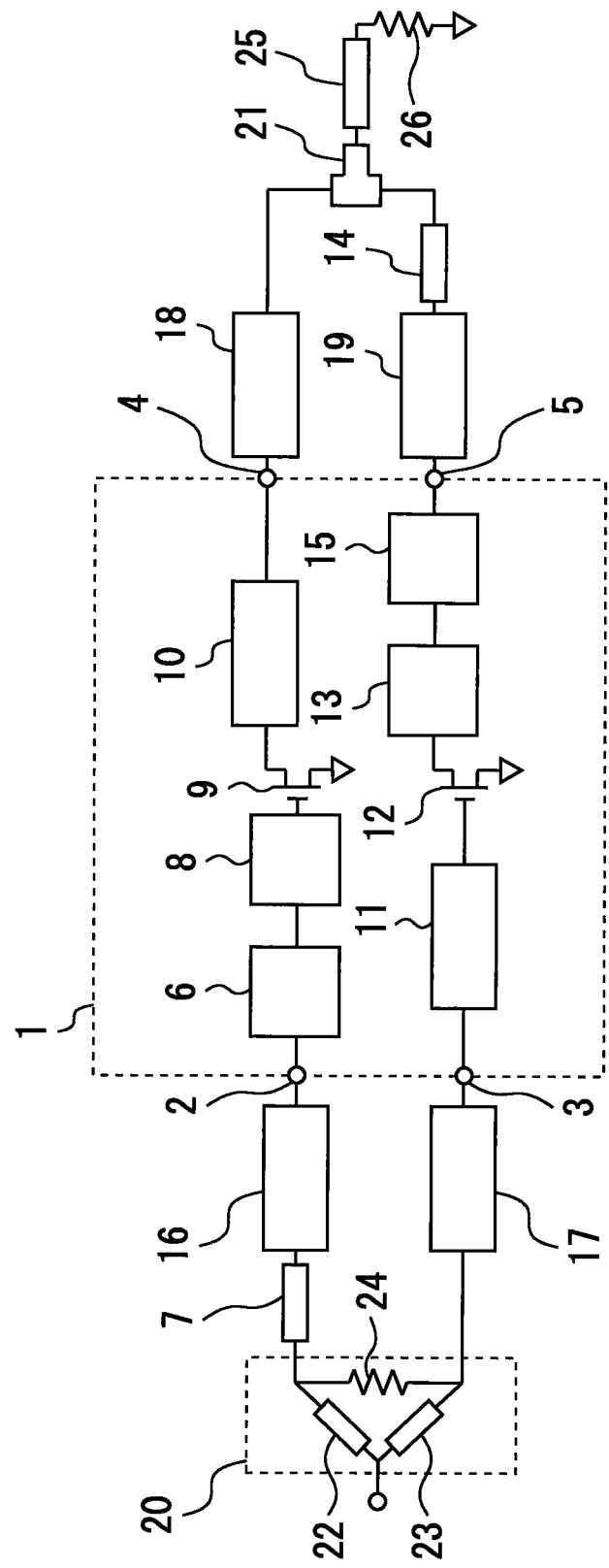
FIG. 5 is a circuit diagram illustrating a Doherty amplifier according to the comparative example.

Subsequently, effects of the present embodiment will be described compared to a comparative example. FIG. 5 is a circuit diagram illustrating a Doherty amplifier according to the comparative example. In the comparative example, the first delay circuit 7 and the second delay circuit 14 are provided outside the package 1. Characteristic impedance of the microstrip line of the first delay circuit 7 and the second delay circuit 14 is 50Ω. Therefore, a phase difference of 90 degrees occurs between the first and the second input terminals 2 and 3, or between the first and the second output terminals 4 and 5 of the package 1. Accordingly, influence due to interference between paths is large.

Figure 6:
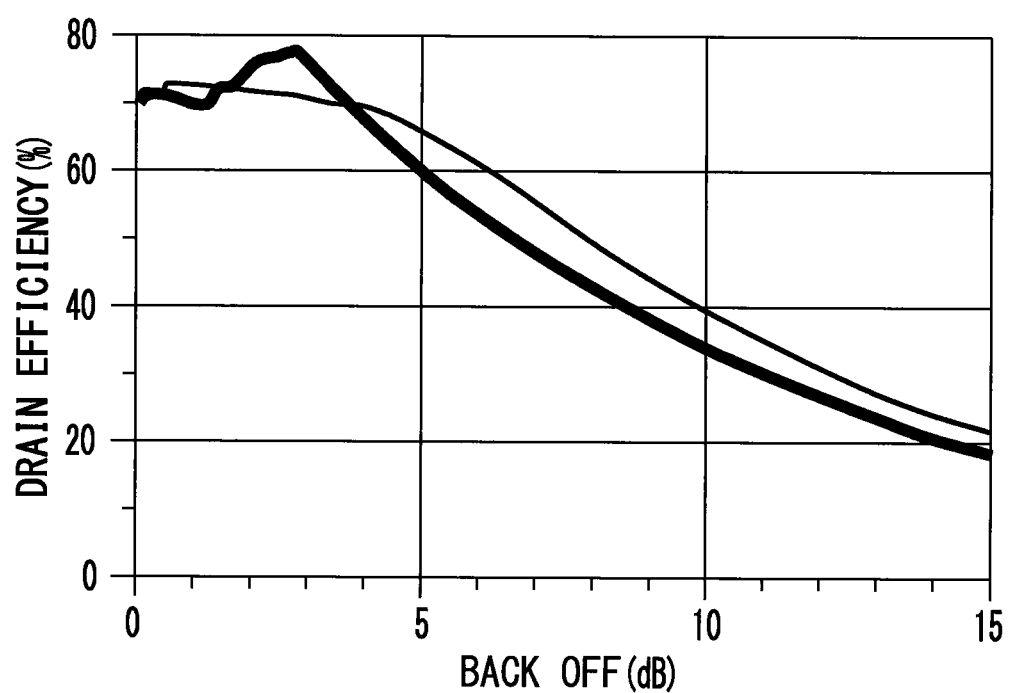
FIG. 6 is a view illustrating a calculation result of drain efficiency of the Doherty amplifier according to the comparative example.
Figure 7:
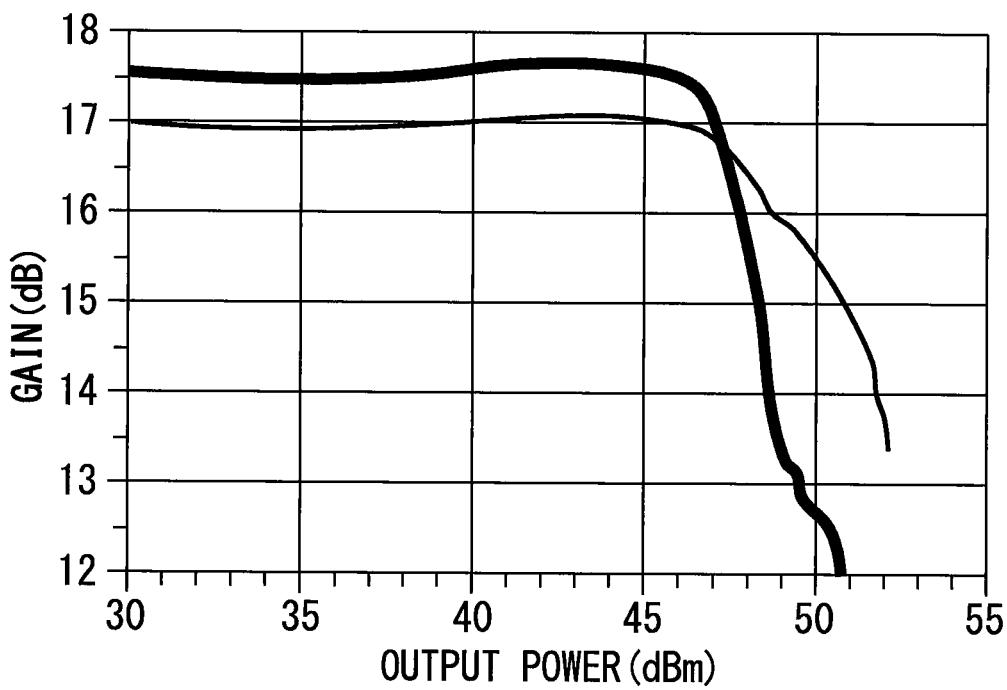
FIG. 7 is a view illustrating a calculation result of a gain of the Doherty amplifier according to the comparative example.
Figure 8:
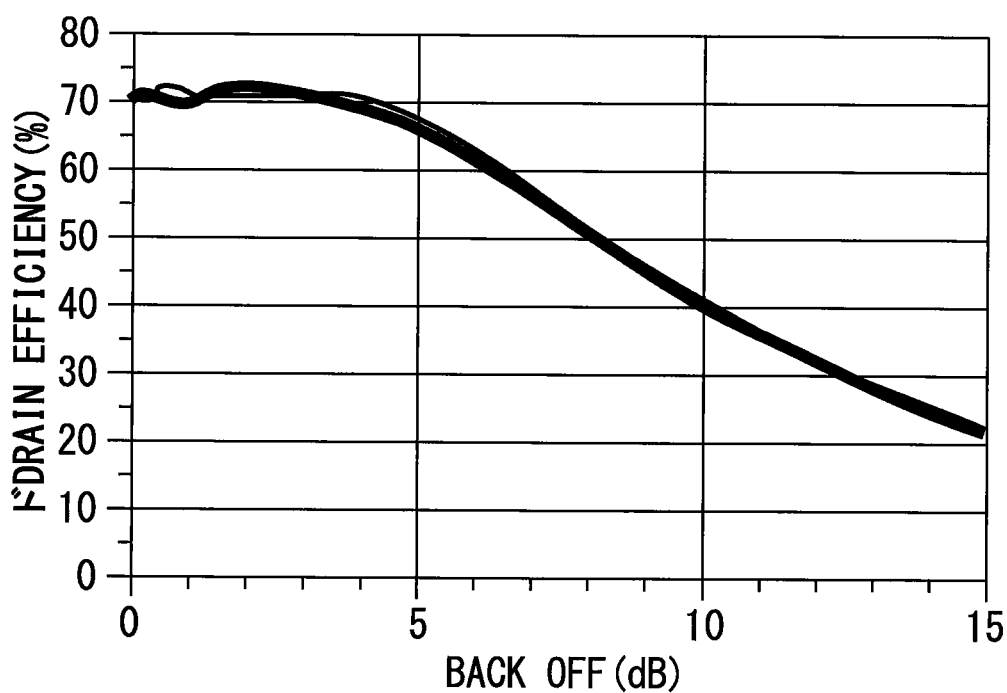
FIG. 8 is a view illustrating a calculation result of drain efficiency of the Doherty amplifier according to Embodiment 1.
Figure 9:
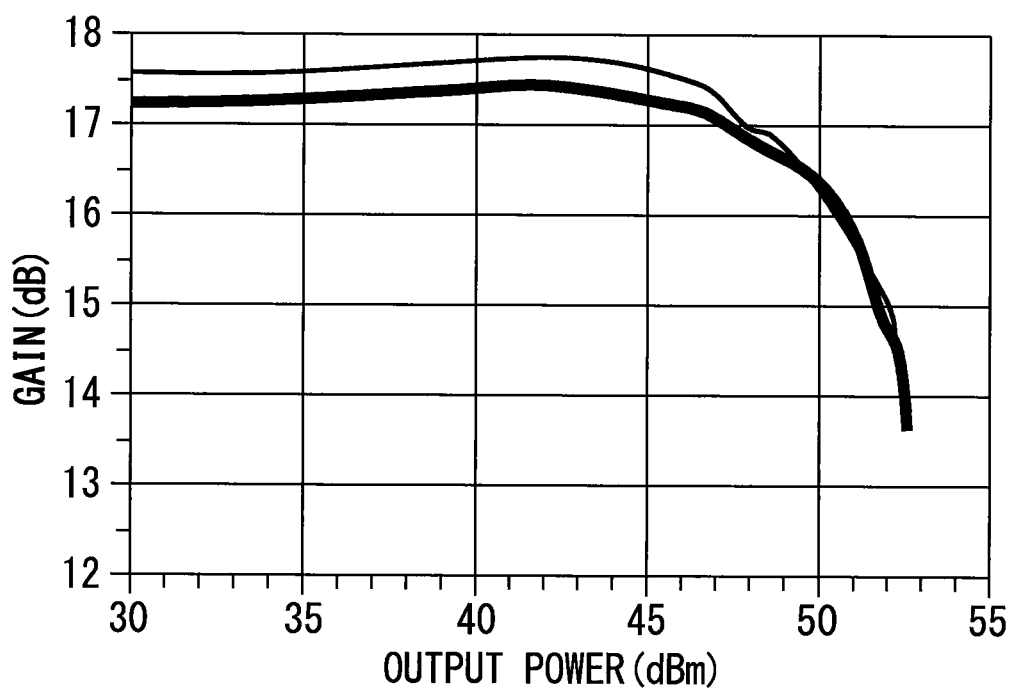
FIG. 9 is a view illustrating a calculation result of a gain of the Doherty amplifier according to Embodiment 1.

FIG. 6 is a view illustrating a calculation result of drain efficiency of the Doherty amplifier according to the comparative example. FIG. 7 is a view illustrating a calculation result of a gain of the Doherty amplifier according to the comparative example. A thick line indicates a case where a distance between terminals is 1 mm, and a thin line indicates a case where a distance between terminals is 100 mm. In the comparative example, decrease in saturation output power and decrease in efficiency upon back off due to decrease in the distance between terminals are recognized. FIG. 8 is a view illustrating a calculation result of drain efficiency of the Doherty amplifier according to Embodiment 1. FIG. 9 is a view illustrating a calculation result of a gain of the Doherty amplifier according to Embodiment 1. It can be understood that, in Embodiment 1, characteristics do not degrade even if the distance between terminals decreases to 1 mm.

Figure 10:
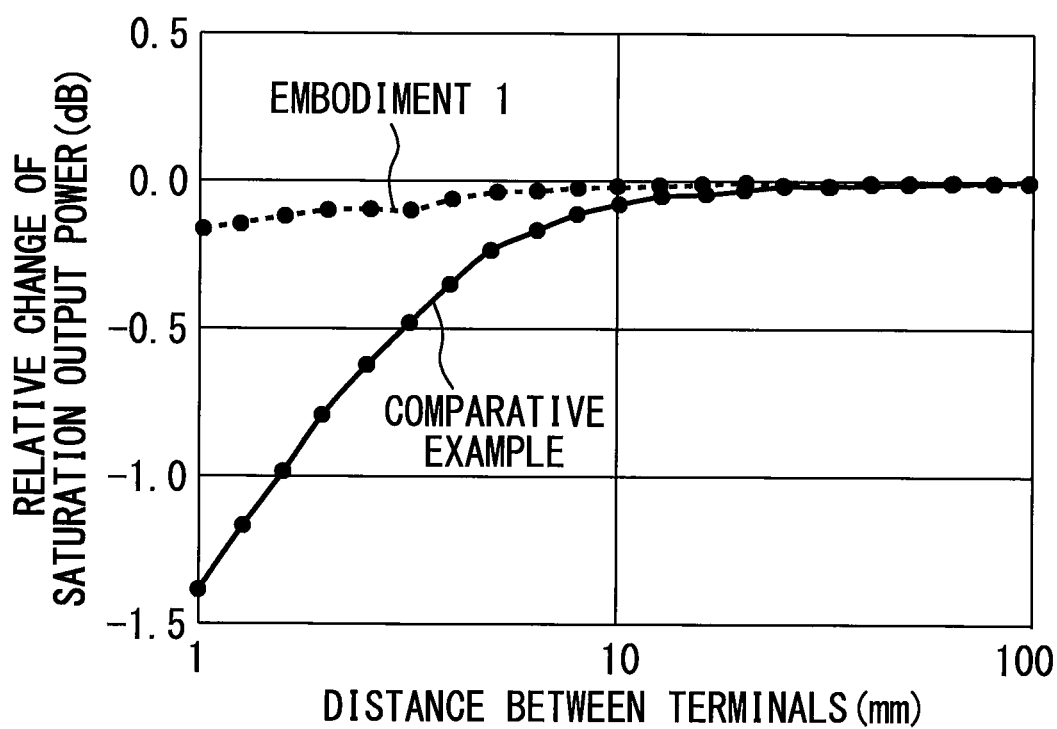
FIG. 10 is a view illustrating a result obtained by calculating influence of the distance between terminals with respect to the saturation output power.

FIG. 10 is a view illustrating a result obtained by calculating influence of the distance between terminals with respect to the saturation output power. A horizontal axis indicates the distance between terminals. A vertical axis indicates relative change of saturation output power based on saturation output power at the distance between terminals of 100 mm at which electromagnetic coupling between terminals can be ignored. It can be understood in the comparative example that, if the distance between terminals becomes smaller than about 10 mm, decrease in saturation output can be seen, and, if the distance between terminals is several millis, saturation output largely decreases. Meanwhile, in Embodiment 1, even if the distance between terminals is 1 mm, saturation output power only slightly decreases.

Figure 11:
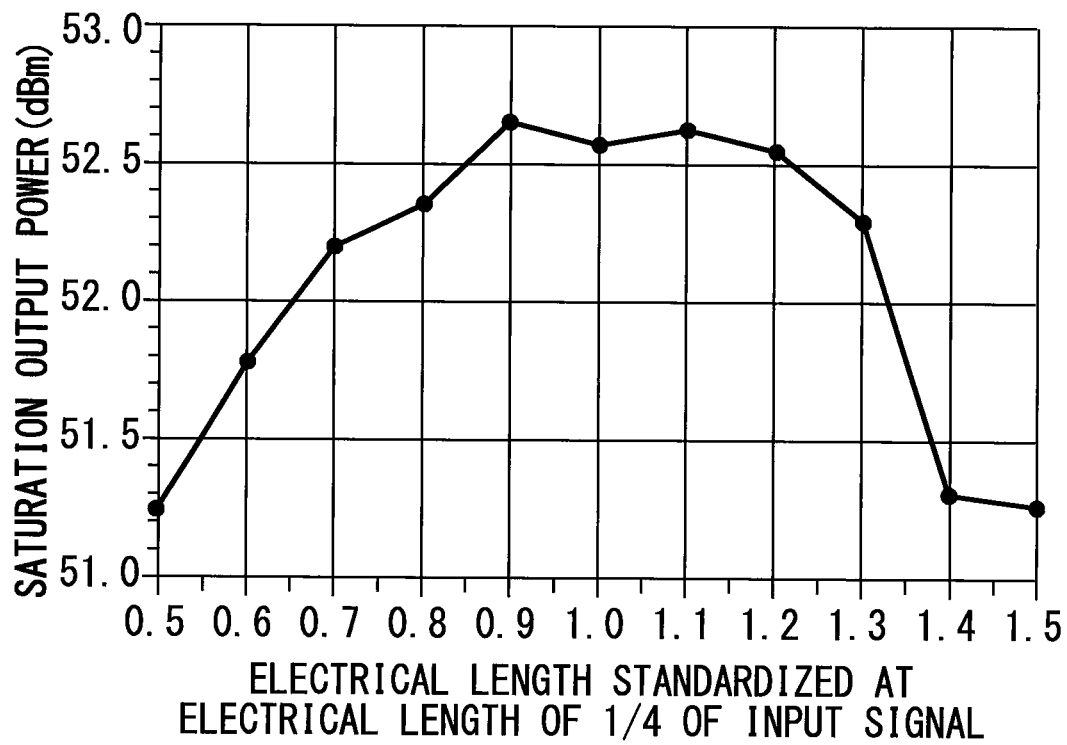
FIG. 11 is a view illustrating a result obtained by calculating saturation output power of the Doherty amplifier according to Embodiment 1 while changing the electrical length of the delay circuit.

FIG. 11 is a view illustrating a result obtained by calculating saturation output power of the Doherty amplifier according to Embodiment 1 while changing the electrical length of the delay circuit. A horizontal axis indicates electrical lengths of the first delay circuit 7 and the second delay circuit 14 standardized at an electrical length of ¼ of an input signal. In a similar manner to a typical Doherty amplifier, the electrical lengths of the first delay circuit 7 and the second delay circuit 14 do not have to be strictly λ4, and, if the electrical lengths are within a range of ¼±20% of a wavelength λ of the input signal, similar effects can be expected.

As described above, in the present embodiment, because the delay circuits are incorporated into the package, it is possible to make phases the same between the input terminals and between output terminals of the package. By this means, it is possible to suppress electromagnetic coupling occurring at a small package. Further, it is possible to easily finely adjust characteristics of the Doherty amplifier at the matching circuits outside the package.

Embodiment 2

Figure 12:
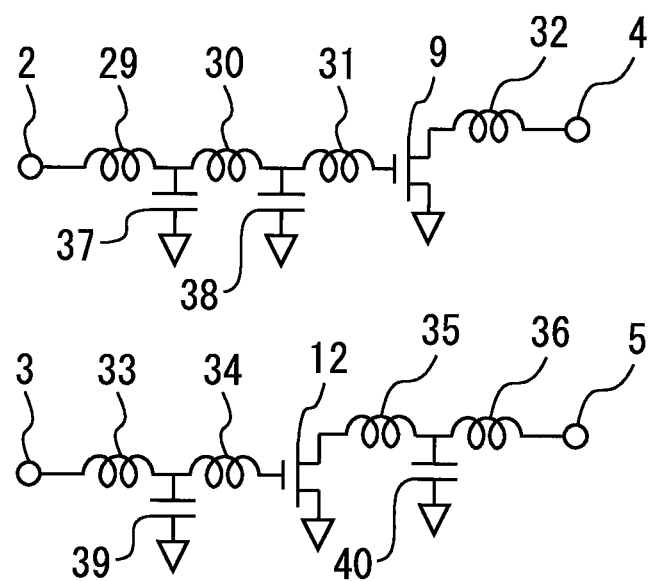
FIG. 12 is an equivalent circuit diagram illustrating inside of a package of a Doherty amplifier according to Embodiment 2.
Figure 13:
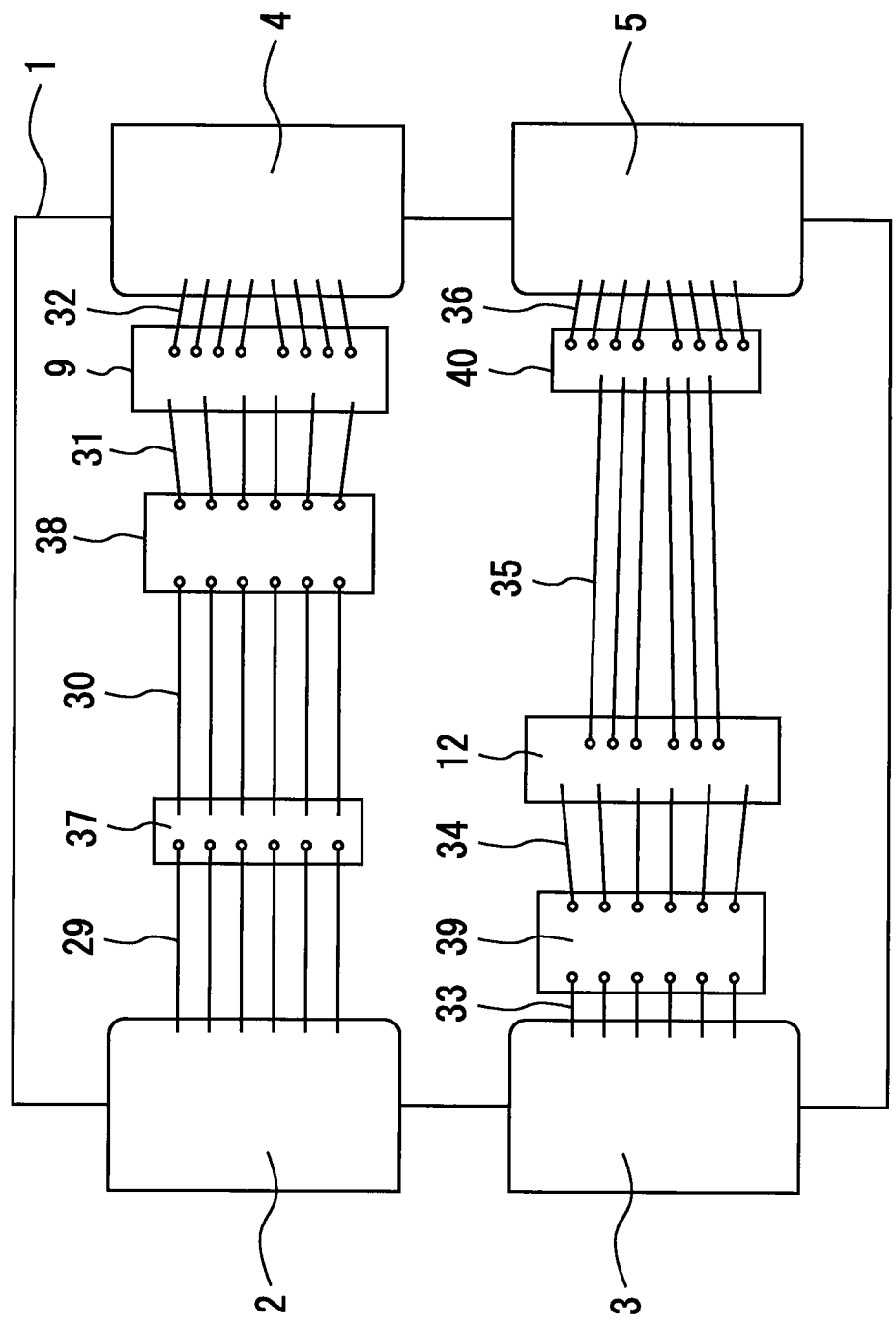
FIG. 13 is a plan view illustrating layout of inside of the package of the Doherty amplifier according to Embodiment 2.

FIG. 12 is an equivalent circuit diagram illustrating inside of a package of a Doherty amplifier according to Embodiment 2. FIG. 13 is a plan view illustrating layout of inside of the package of the Doherty amplifier according to Embodiment 2. Unlike with Embodiment 1, the first delay circuit 7 and the second delay circuit 14 are constituted with lumped parameters instead of being constituted with microstrip lines. Inductors 29 to 36 are constituted with bonding wires. Capacitors 37 to 40 are parallel-plate capacitors, or the like, constituted with a MIM capacitor formed on a semiconductor substrate or a metal pattern and a heatsink on a dielectric substrate.

Figure 14:
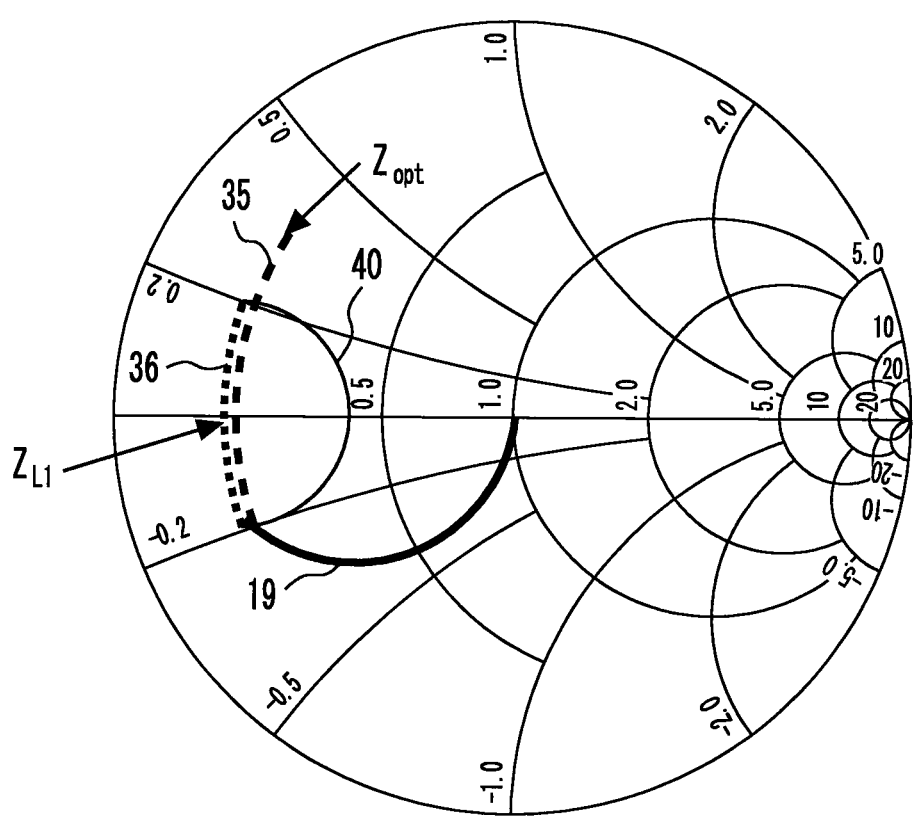
FIG. 14 is a view illustrating impedance transformation of an output matching circuit of a second amplifier according to Embodiment 2.

A T-type circuit to which the capacitor 40 is shunt-connected between two inductors 35 and 36 which are connected in series corresponds to the second delay circuit 14 in Embodiment 1. FIG. 14 is a view illustrating impedance transformation of an output matching circuit of a second amplifier according to Embodiment 2. This T-type circuit does not contribute to impedance transformation, and is designed so that only a passband phase is delayed by 90 degrees. In a similar manner, a T-type circuit to which the capacitor 37 is shunt-connected between two inductors 29 and 30 which are connected in series corresponds to the first delay circuit 7.

While, in Embodiment 1, the first delay circuit 7 and the second delay circuit 14 are constituted with high dielectric substrates, in Embodiment 2, the first delay circuit 7 and the second delay circuit 14 are constituted with lumped parameters. Therefore, circuit sizes of the first delay circuit 7 and the second delay circuit 14 can be easily made smaller. Further, as illustrated in FIG. 13, the first amplifier 9 and the second amplifier 12 are mounted at different positions with respect to a signal traveling direction. Therefore, it is possible to suppress interference between bonding wires as well as interference between input terminals and between output terminals.

Embodiment 3

Figure 15:
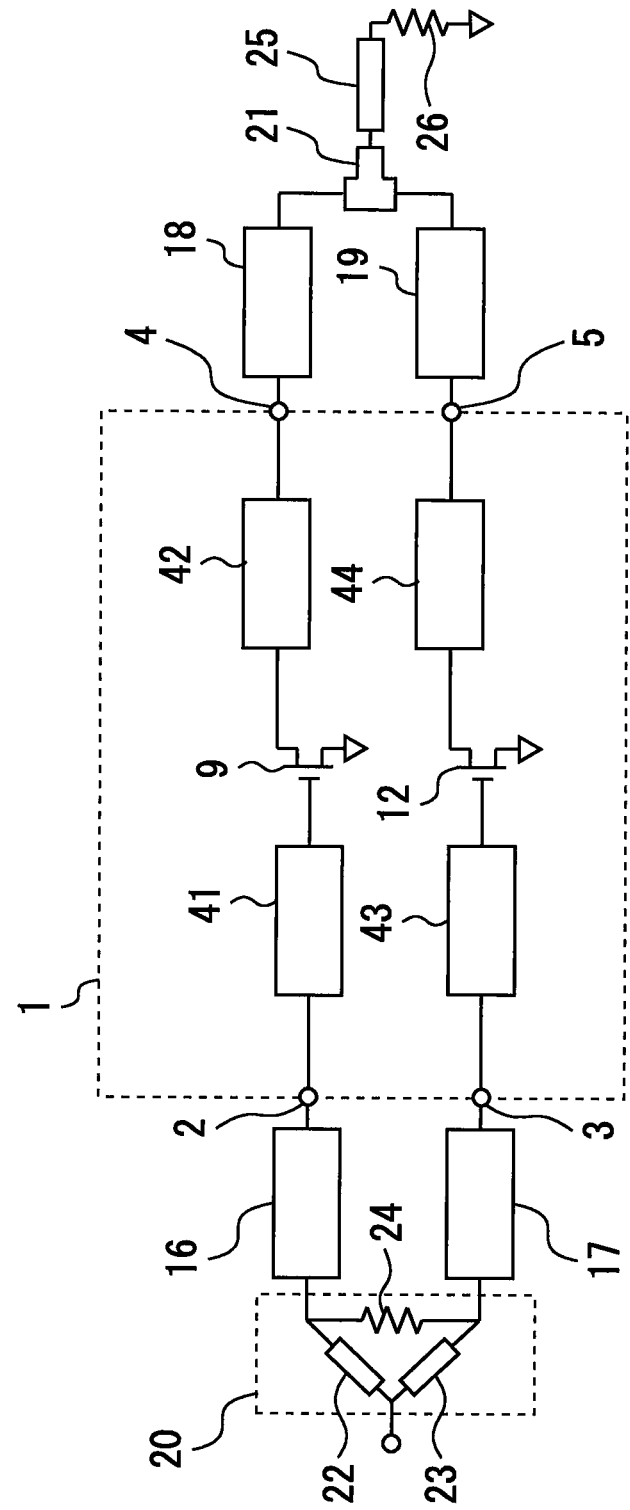
FIG. 15 is a view illustrating a Doherty amplifier according to Embodiment 3.

FIG. 15 is a view illustrating a Doherty amplifier according to Embodiment 3. In the present embodiment, the first input matching circuit 41, the first amplifier 9 and the first output matching circuit 42 are sequentially connected between the first input terminal 2 and the first output terminal 4 inside the package 1. The second input matching circuit 43, the second amplifier 12 and the second output matching circuit 44 are sequentially connected between the second input terminal 3 and the second output terminal 5 inside the package 1.

An electrical length from the first input terminal 2 to the first amplifier 9 is longer than an electrical length from the second input terminal 3 to the second amplifier 12 within a range of ¼±20% of a wavelength λ of an input signal. Therefore, a passband phase of the first input matching circuit 41 is delayed by 90 degrees with respect to a passband phase of the second input matching circuit 43.

An electrical length from the second amplifier 12 to the second output terminal 5 is longer than an electrical length from the first amplifier 9 to the first output terminal 4 within a range of ¼±20% of a wavelength λ of an input signal. Therefore, a passband phase of the second output matching circuit 44 is delayed by 90 degrees with respect to a passband phase of the first output matching circuit 42.

The second output matching circuit 44 and the fourth matching circuit 19 are designed so that impedance of output seen from a drain end of the second amplifier 12 becomes optimal load impedance $Z_{opt}$ in a similar manner to Embodiment 1. However, the second output matching circuit 44 contributes to impedance transformation, and is designed so that a passband phase is delayed by 90 degrees with respect to the first output matching circuit 42. The first input matching circuit 41 and the second input matching circuit 43 are also similarly designed.

Figure 16:
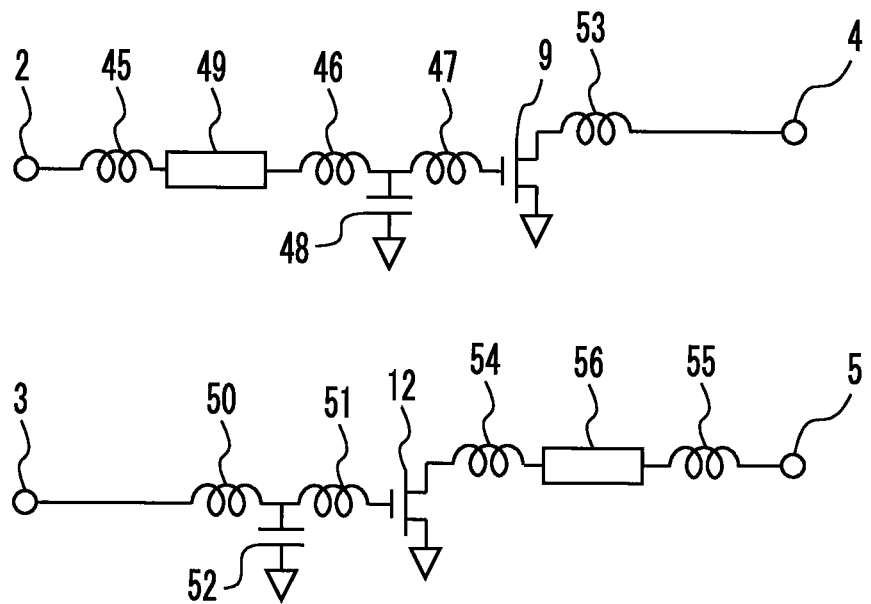
FIG. 16 is an equivalent circuit diagram illustrating inside of the package of the Doherty amplifier according to Embodiment 3.

FIG. 16 is an equivalent circuit diagram illustrating inside of the package of the Doherty amplifier according to Embodiment 3. The first input matching circuit 41 includes inductors 45 to 47, a capacitor 48 and a microstrip line 49. The second input matching circuit 43 includes inductors 50 and 51, and a capacitor 52. The first output matching circuit 42 includes an inductor 53. The second output matching circuit 44 includes inductors 54 and 55 and a microstrip line 56.

Figure 17:
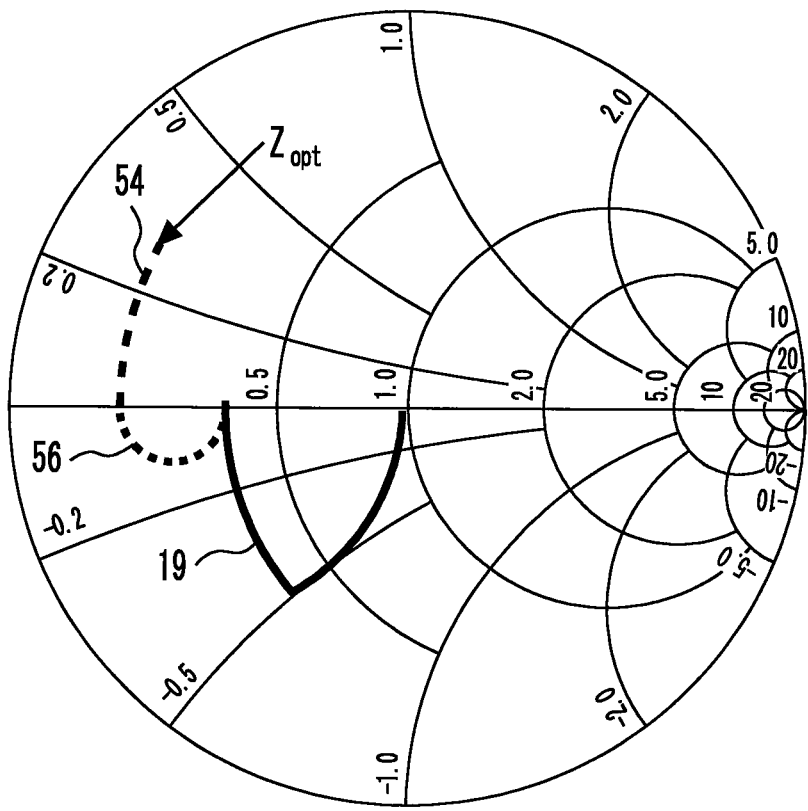
FIG. 17 is a view illustrating impedance transformation of the output matching circuit of the first amplifier according to Embodiment 3.
Figure 18:
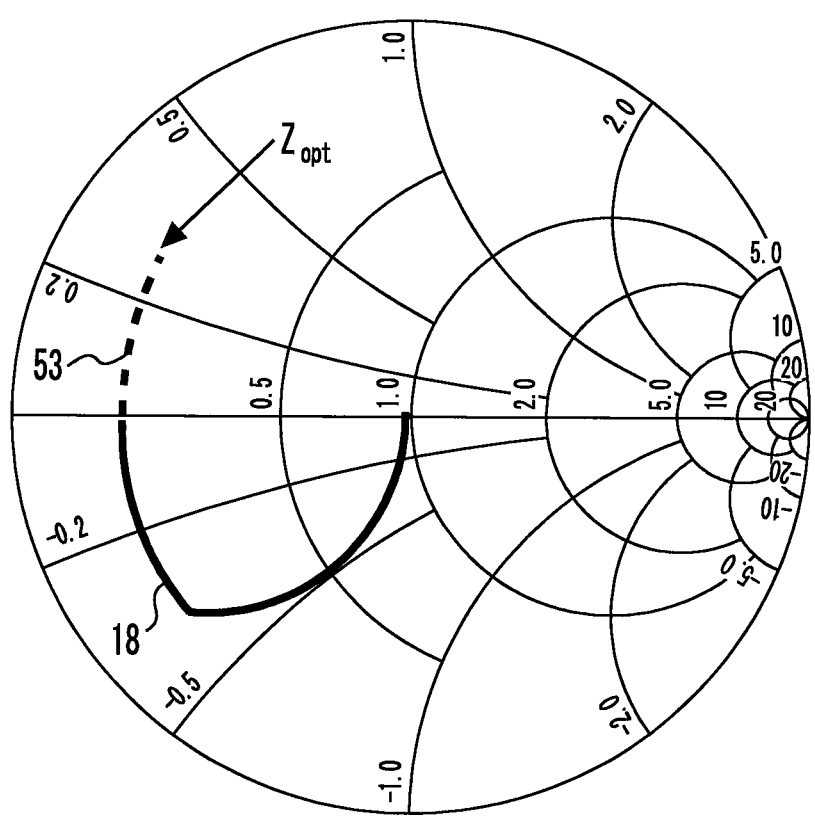
FIG. 18 is a view illustrating impedance transformation of the output matching circuit of the second amplifier according to Embodiment 3.

FIG. 17 is a view illustrating impedance transformation of the output matching circuit of the first amplifier according to Embodiment 3. FIG. 18 is a view illustrating impedance transformation of the output matching circuit of the second amplifier according to Embodiment 3. Impedance of the first amplifier 9 and the second amplifier 12 is both transformed from 50Ω to $Z_{opt}$. Note that a phase is delayed by 90 degrees at the microstrip line 56 at the second output matching circuit 44. This similarly occurs in the first input matching circuit 41. Therefore, in a similar manner to Embodiment 1, phases of signals become the same between input terminals and between output terminals. Note that, if a passband phase difference between the first output matching circuit 42 and the second output matching circuit 44 is 90 degrees, and a passband phase difference between the first input matching circuit 41 and the second input matching circuit 43 is 90 degrees, similar effects can be obtained also in circuits other than the circuits illustrated in FIG. 16.

While the first delay circuit 7 and the second delay circuit 14 in Embodiment 1 do not contribute to impedance transformation, the first input matching circuit 41 and the second output matching circuit 44 in the present embodiment contribute to impedance transformation. Therefore, in addition to the effects of Embodiment 1, because it is possible to enable transformation of impedance to be performed in multiple stages, broadband characteristics can be expected.

REFERENCE SIGNS LIST 1 package; 2 first input terminal; 3 second input terminal; 4 first output terminal; 5 second output terminal; 6 first input matching circuit; 7 first delay circuit; 8 second input matching circuit; 9 first amplifier; 10 first output matching circuit; 11 third input matching circuit; 12 second amplifier; 13 second output matching circuit; 14 second delay circuit; 15 third output matching circuit; 16 first matching circuit; 17 second matching circuit; 18 third matching circuit; 19 fourth matching circuit; 20 division circuit; 21 synthetic circuit; 29,30,35,36 inductor; 37,40 capacitor; 41 first input matching circuit; 42 first output matching circuit; 43 second input matching circuit; 44 second output matching circuit

The invention claimed is:

1. A Doherty amplifier comprising:
   a package including first and second input terminals which are adjacent to each other, and first and second output terminals which are adjacent to each other;
   a first input matching circuit, a first delay circuit, a second input matching circuit, a first amplifier, and a first output matching circuit sequentially connected between the first input terminal and the first output terminal inside the package;
   a third input matching circuit, a second amplifier, a second output matching circuit, a second delay circuit, and a third output matching circuit sequentially connected between the second input terminal and the second output terminal inside the package;
   first to fourth matching circuits respectively connected to the first input terminal, the second input terminal, the first output terminal and the second output terminal outside the package;
   a division circuit provided outside the package, equally dividing an input signal into two signals and respectively inputting the two signals to the first and the second input terminals via the first and the second matching circuits; and
   a synthetic circuit provided outside the package and synthesizing signals input from the first and the second output terminals via the third and the fourth matching circuits into one signal.

2. The Doherty amplifier according to claim 1, wherein impedance of an input side seen from an output end of the first input matching circuit is first impedance at a frequency of the input signal,
   impedance of an output side seen from an input end of the third output matching circuit is second impedance at the frequency of the input signal,
   the first and second impedance do not have an imaginary part, characteristic impedance of the first delay circuit is same as the first impedance, characteristic impedance of the second delay circuit is same as the second impedance, and electrical lengths of the first and second delay circuits are within a range of ¼±20% of a wavelength of the input signal.

3. The Doherty amplifier according to claim 2, wherein the first and second delay circuits are microstrip lines.

4. The Doherty amplifier according to claim 2, wherein each of the first and second delay circuits is a circuit to which a capacitor is shunt-connected between two inductors connected in series.

5. A Doherty amplifier comprising:

a package including first and second input terminals which are adjacent to each other, and first and second output terminals which are adjacent to each other;

a first input matching circuit, a first amplifier, and a first output matching circuit sequentially connected between the first input terminal and the first output terminal inside the package;

a second input matching circuit, a second amplifier, and a second output matching circuit sequentially connected between the second input terminal and the second output terminal inside the package;

first to fourth matching circuits respectively connected to the first input terminal, the second input terminal, the first output terminal and the second output terminal outside the package;

a division circuit provided outside the package, equally dividing an input signal into two signals and respectively inputting the two signals to the first and the second input terminals via the first and the second matching circuits; and a synthetic circuit provided outside the package and synthesizing signals input from the first and the second output terminals via the third and the fourth matching circuits into one signal, wherein an electrical length from the first input terminal to the first amplifier is longer than an electrical length from the second input terminal to the second amplifier within a range of ¼±20% of a wavelength of the input signal, and an electrical length from the second amplifier to the second output terminal is longer than an electrical length from the first amplifier to the first output terminal within a range of ¼±20% of the wavelength of the input signal.

* * * * *